United States Patent
Nejedlo et al.

(10) Patent No.: US 7,047,458 B2
(45) Date of Patent: May 16, 2006

(54) TESTING METHODOLOGY AND APPARATUS FOR INTERCONNECTS

(75) Inventors: Jay Nejedlo, Wilsonville, OR (US); Sean R. Babcock, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 340 days.

(21) Appl. No.: 10/319,517

(22) Filed: Dec. 16, 2002

(65) Prior Publication Data
US 2004/0117709 A1 Jun. 17, 2004

(51) Int. Cl.
*G11C 29/00* (2006.01)
*G01R 31/28* (2006.01)

(52) U.S. Cl. ...................... 714/715; 714/738
(58) Field of Classification Search ............ 714/712, 714/715, 733, 735, 738, 33
See application file for complete search history.

(56) References Cited

U.S. PATENT DOCUMENTS

| | | | | |
|---|---|---|---|---|
| 5,726,991 A | * | 3/1998 | Chen et al. | 714/704 |
| 6,357,027 B1 | * | 3/2002 | Frankowsky | 714/738 |
| 6,385,236 B1 | * | 5/2002 | Chen | 375/224 |
| 6,505,317 B1 | * | 1/2003 | Smith et al. | 714/738 |
| 6,609,221 B1 | * | 8/2003 | Coyle et al. | 714/715 |

* cited by examiner

*Primary Examiner*—Shelly Chase
(74) *Attorney, Agent, or Firm*—Blakely, Sokoloff, Taylor & Zafman LLP

(57) ABSTRACT

A built-in self test (IBIST) architecture/methodology is provided for testing the functionality of an interconnect (such as a bus) between two components. This IBIST architecture may include a pattern generator and a pattern checker. The pattern checker operates to compare a received plurality of bits (for the pattern generator) with a previously stored plurality of bits.

22 Claims, 6 Drawing Sheets

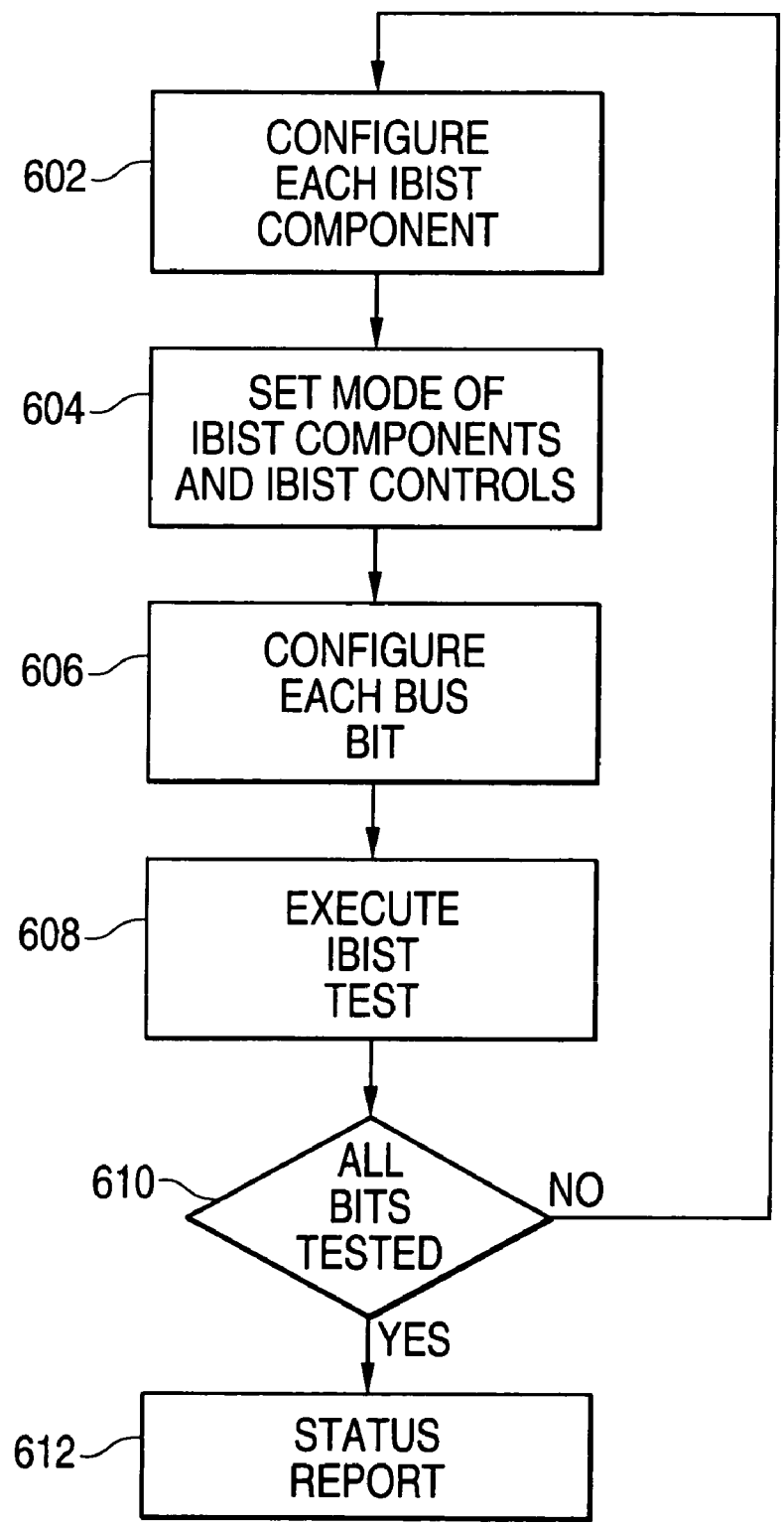

US 7,047,458 B2

TESTING METHODOLOGY AND APPARATUS FOR INTERCONNECTS

FIELD

The present invention relates to computer systems, and more particularly relates to a methodology/mechanism for testing interconnects between components of a computer system.

BACKGROUND

Computing devices and systems contain components (such as circuit boards) as well as interconnects and interfaces between various components. During design of such systems, and prior to distribution to consumers, these interconnects may be tested to determine their proper functionality. However, as component to component bus speeds increase and circuit boards become smaller, testing these bus connections becomes increasingly difficult and in some cases impossible.

Board level features such as in-circuit testpoints have been eliminated on high performance buses (i.e., speeds greater than 200 MHz.) due to board/component electrical issues. As bus speeds increase beyond 500 MHz., additional testability features such as boundary scan may also be reduced and/or eliminated due to restricted timing budgets. Further, the board/system interconnect fault spectrum associated with high speed system buses has expanded beyond simple opens/shorts due to limited tolerance to transmission line loss, impedance discontinuities, return path discontinuities, intersymbol interferences (ISI), crosstalk, power supply collapse, nonlinear driver effects, non-optimum $V_{OH}$, $V_{OL}$ levels, non-ideal termination and uncentered Vref, for example.

Testing processes may be employed to address the associated interconnect fault spectrum. One test process may use a system level environment (board functional test) incorporating a significant amount of hardware to accomplish the testing in a high volume manufacturing (HVM) test environment. This may be expensive and time consuming. Additionally, this type of testing may not provide full coverage and may have poor diagnostic granularity. Also, a majority of defective components may fail to boot an operating system and thus testing can not be accomplished. Another process may use physical access such as probing to test points (i.e., in-circuit testers) on the board. However, the probing may be invasive to high speed bus testing, expensive and/or obsolete for buses operating above 200 MHz.

BRIEF DESCRIPTION OF THE DRAWINGS

A better understanding of the present invention will become apparent from the following detailed description of example embodiments and the claims when read in connection with the accompanying drawings, all forming a part of the disclosure of this invention. While the following written and illustrated disclosure focuses on disclosing example embodiments of the invention, it should be clearly understood that the same is by way of illustration and example only and that the invention is not limited thereto.

The following represents brief descriptions of the drawings in which like reference numerals represent like elements and wherein:

FIG. 5 is a flow chart showing operations according to an example embodiment of the present invention.

DETAILED DESCRIPTION

Figure 1A:
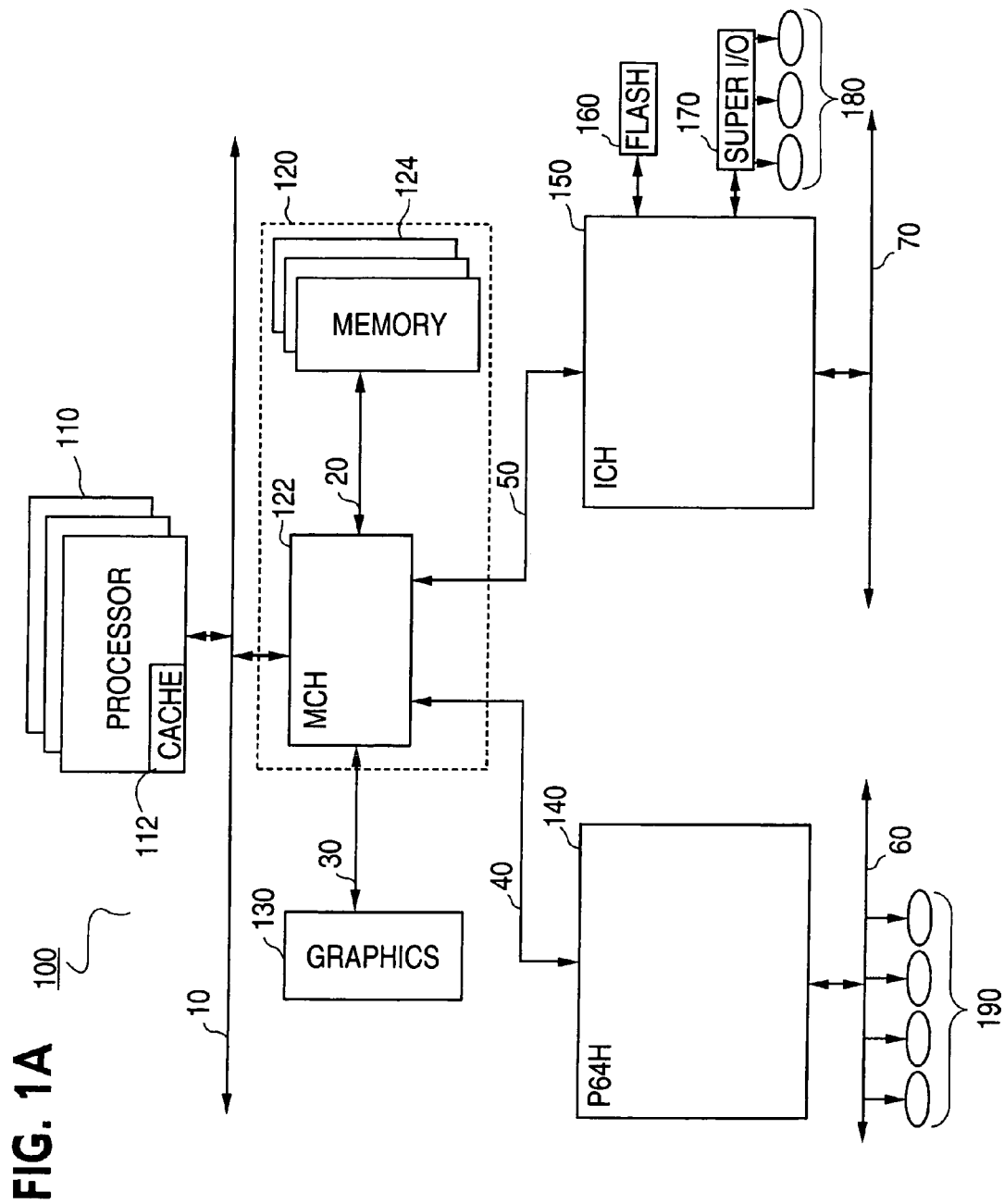
FIG. 1A is a computer system platform according to an example arrangement.

In the following detailed description, like reference numerals and characters may be used to designate identical, corresponding or similar components in differing figure drawings. Further, in the following detailed description, well known power/ground connections to components may not be shown within the FIGS. for simplicity of illustration and discussion, and so as not to obscure the invention. Further, arrangements may be shown in block diagram form in order to avoid obscuring the invention, and also in view of the fact that specifics with respect to implementation of such block diagram arrangements may be highly dependent upon the platform within which the present invention is to be implemented. That is, such specifics should be well within the purview of one skilled in the art. Where specific details (e.g., circuits) are set forth in order to describe example embodiments of the invention, it should be apparent to one skilled in the art that the invention can be practiced without, or with variation of, these specific details. Finally, it should be apparent that differing combinations of hard-wired circuitry may be used to implement embodiments of the present invention. That is, embodiments of the present invention are not limited to any specific combination of hardware.

Although example embodiments of the present invention may be described using an example system block diagram in an example personal computer (PC) environment, practice of the invention is not limited thereto. That is, embodiments of the present invention may be able to be practiced with other types of electronic devices (e.g., servers) and/or systems (mainframes), and in other types of environments (e.g., networks).

Embodiments may hereafter be described with respect to testing of interconnects. As is well known to one skilled in the art, interconnects relate to connections (such as buses) between components.

FIG. 1A shows a computer system platform according to an example arrangement. Other arrangements are also possible. As shown in FIG. 1A, the computer system 100 may include a processor subsystem 110, a memory subsystem 120 coupled to the processor subsystem 110 by a front side bus 10, graphics 130 coupled to the memory subsystem 120 by a graphics bus 30, one or more host chipsets (labeled 140-150) coupled to the memory subsystem 120 by hub links 40 and 50 for providing an interface with peripheral buses such as Peripheral Component Interconnect (PCI) buses 60 and 70 of different bandwidths and operating speeds, a flash memory 160, and a super I/O 170 coupled to the chipset 150 by a low pin count (LPC) bus for providing an interface with a plurality of I/O devices 180 such as a keyboard controller for controlling operations of an alphanumeric keyboard, a cursor control device such as a mouse, track ball, touch pad, joystick, etc., a mass storage device such as magnetic tapes, hard disk drives (HDD), and floppy disk drives (FDD), and serial and parallel ports to printers, scanners, and display devices. A plurality of I/O devices 190 may be provided along the PCI bus 60. The computer system 100 may be configured differently or employ some or different components than those shown in FIG. 1A.

The processor subsystem 110 may include a plurality of host processors and a cache subsystem 112. The memory subsystem 120 may include a memory controller hub (MCH) 122 coupled to the host processors by the front side bus 10 (i.e., host or processor bus) and at least one memory element 124 coupled to the MCH 122 by a memory bus 20. The memory element 124 may be a dynamic random-access-memory (DRAM), or may be a read-only-memory (ROM), video random-access-memory (VRAM) and the like. The memory element 124 stores information and instructions for use by the host processor. The graphics 130 may be coupled to the main controller hub 122 of the memory subsystem 120 by the graphics bus 30, and may include, for example, a graphics controller, a local memory and a display device (e.g. cathode ray tube, liquid crystal display, flat panel display, etc.).

The host chipsets (labeled 140 and 150) may be Peripheral Component Interconnect (PCI) bridges (e.g., host, PCI-PCI, or standard expansion bridges in the form of PCI chips such as, for example, the PIIX4® chip and PIIX6® chip manufactured by Intel Corporation). In particular, the chipsets may correspond to a Peripheral Component Interconnect (PCI) 64-bit hub (P64H 140 or P64H2) and an input/output controller hub (ICH 150). The P64H 140 and the ICH 150 may be coupled to the MCH 122 of the memory subsystem 120 respectively by 16 bits and 8 bits hub links 40 and 50, for example, and may operate as an interface between the front side bus 10 and peripheral buses 60 and 70 such as PCI buses of different bandwidths and operating speeds. The PCI buses may be high performance 32 or 64 bit synchronous buses with automatic configurability and multiplexed address, control and data lines as described in the version of "*PCI Local Bus Specification, Revision* 2.2" set forth by the PCI Special Interest Group (SIG) on Dec. 18, 1998 for add-on arrangements (e.g., expansion cards) with new video, networking, or disk memory storage capabilities. For example, the PCI bus 60 of 64-bits and 66 MHz may couple to the P64H 140. Similarly, the PCI bus 70 of 32-bits and 33 MHz may couple to the ICH 150. Other types of bus architectures such as Industry Standard Architecture (ISA) and Expanded Industry Standard Architecture (EISA) buses may also be utilized.

The hub links 40 and 50 that couple the P64H 140 and the ICH 150 to the MCH 122 of the memory subsystem 120 may be primary PCI buses of different bandwidths and operating speeds. The peripheral buses 60 and 70 that couple the P64H 140 and the ICH 150 to I/O devices may be secondary PCI buses of different bandwidths and operating speeds.

Figure 1B:
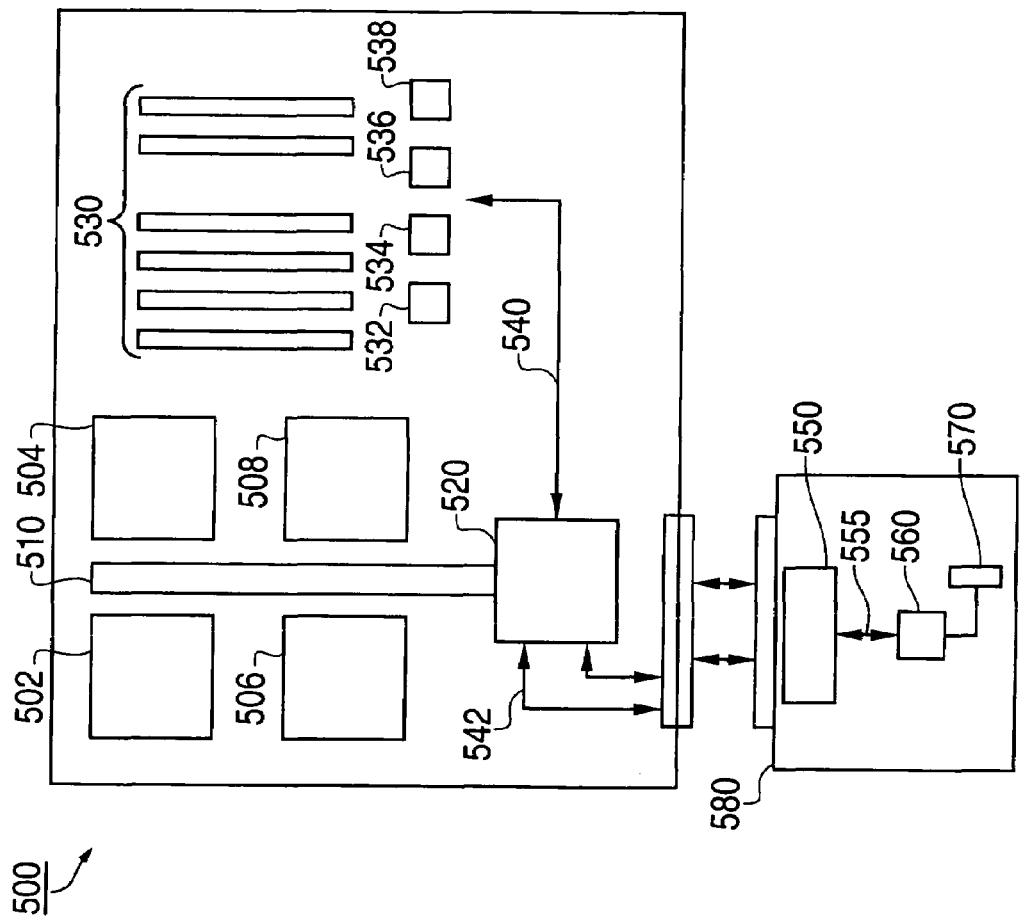
FIG. 1B is a computer system platform according to an example arrangement.

FIG. 1B shows a computer system platform according to another example arrangement. Other arrangements are also possible. In particular, FIG. 1B shows a computer system platform 500 that includes a plurality of processors 502, 504, 506 and 508 coupled by a bus 510 to a memory controller hub 520. The memory controller hub 520 may also be coupled by a Rambus channel 540, for example, to a plurality of buffers 532, 534, 536 and 538. The buffers 532, 534, 536 and 538 may be further coupled to dual-in-line memory 530. The memory controller hub 520 may also be coupled through a scalability port 542 and through board interfaces to an I/O board 580. The I/O board 580 may include an interface, an I/O hub 550, a switch hub 560 coupled to the I/O hub 550 by a bus 555 and a test card 570.

Embodiments of the present invention may include Interconnect Built-in-Self Test (IBIST) architecture. The IBIST architecture (or portions thereof) may be provided within components of the example computer system platform shown in FIG. 1A, the example computer system platform shown in FIG. 1B and/or in other types of computer system platforms. Additionally, the IBIST architecture may also be provided within other types of components that are coupled to interconnects such as buses and/or coupled to interfaces. For example, in the computer system platform shown in FIG. 1A, the IBIST architecture (or portions thereof) may be provided within each of the processors of the processor subsystem 110, the memory controller hub 122, the graphics 130, the host chipsets 140 and 150, etc. In the computer system platform shown in FIG. 1B, the IBIST architecture (or portions thereof) may be provided within the processors 502, 504, 506 and 508, the buffers 532, 534, 536, 538, the memory controller hub 520, the I/O hub 550, the bus switch 560 and the test card 570. The IBIST architecture allows testing of interconnects (such as buses) between components (such as boards) containing the IBIST architecture (or portions thereof). For example, the IBIST architecture/methodology may allow testing of the buses 10, 20, 30, 40 and 50 in the FIG. 1A computer system platform and/or allow testing of the bus 510, the Rambus channel 540, the bus 542, the bus 555 and the interconnects within the I/O board 580 in the FIG. 1B computer system platform. The IBIST architecture also allows testing of the interface between boards.

During a testing operation, the IBIST architecture/methodology may utilize component interconnect and timing paths as in normal operation of the components. The input/output latches may be provided within an IBIST loop to appropriately latch data. Precise control of bit patterns may be possible due to the IBIST operation being independent of the operating system or cache protocol. The testing operation may occur during manufacturing, during design verification and/or during design validation, for example. The testing operation may also occur throughout the life of the platform.

The IBIST architecture/methodology may utilize a silicon based IBIST architecture (i.e., integrated into the processors and chipset components) as well as test cards to facilitate system level interconnect testing. The test cards may be used on exposed interfaces, including memory and I/O slots of a platform under test, which may maximize test coverage and flexibility. For example, the test card 570 shown in FIG. 1B may include features of the IBIST architecture/methodology. On-board control may facilitate the test configuration, sequencing and result analysis of integrated component capabilities.

A control hierarchy of the IBIST methodology may include chip-level analysis, board-level analysis and/or system-level analysis for platform testing. One interface on the computer system platform may allow access and capability to each of the chip-level test, the board-level test and the system-level test.

At the chip level, components may (or may not) contain internal IBIST circuit elements containing proper functionality for IBIST testing. For example, and as will be described below, the internal IBIST circuit elements may include a pattern generator, a pattern checker, an error checking device, local control (or a local control device), a pattern latch and/or a pattern sequencer. While these various circuit elements may be generally described with block diagrams, one skilled in the art would understand the specific operations and features of the elements within the blocks. Additionally, each component containing the IBIST functionality may be accessible for execution via a resident (on-chip) IBIST controller (such as a local control device), for example. Each component's IBIST controller may be accessible via a boundary scan or other type of mechanism.

Board level testing may be controlled through a board level bus via an external or on-board IBIST controller. IBIST functions may be executed through protocols programmed into the board/platform IBIST controller. Test configuration, execution and module level diagnosis may be carried out automatically by the protocols with the IBIST controller.

Additionally, platform level testing may be controlled through a system level bus via an external or platform IBIST controller. IBIST functions may be executed through protocols programmed into the board/platform IBIST controller. Test configuration, execution and module level diagnosis may be carried out automatically by the protocols with the IBIST controller.

Figure 2:
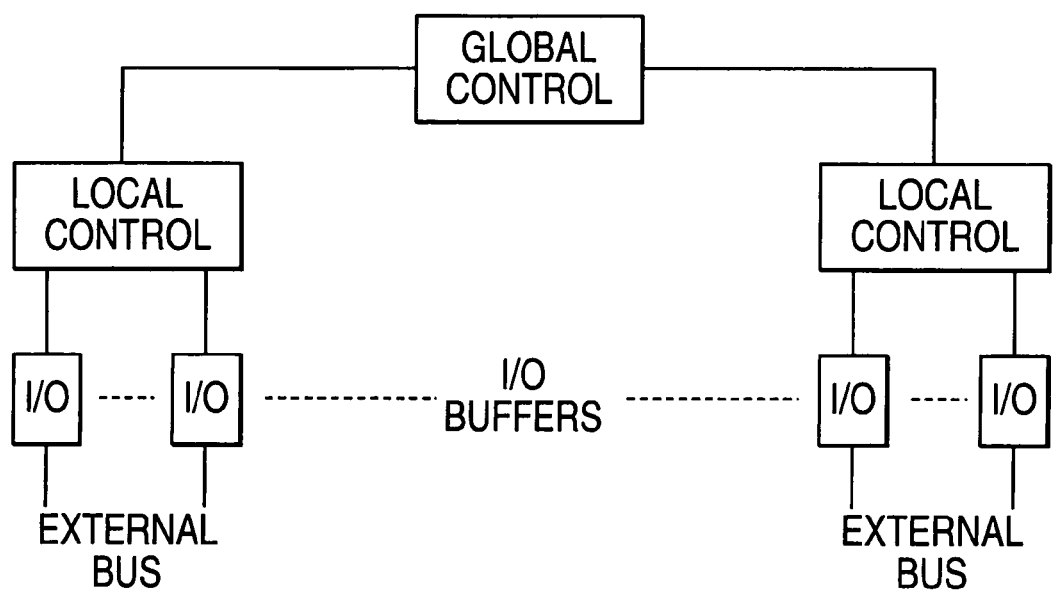
FIG. 2 is a block diagram showing circuit connections to buses according to an example embodiment of the present invention.

FIG. 2 is a block diagram showing circuit connections to an external bus (such as one of the buses in FIGS. 1A and 1B, for example) according to an example embodiment of the present invention. Other embodiments and configurations are also within the scope of the present invention. More specifically, FIG. 2 shows that an external bus may be coupled to a plurality of I/O buffers. Each I/O buffer may be associated with a different bit. Each I/O buffer may contain pattern buffer and select logic for pattern transmission as well as error checking logic for pattern capture. The pattern buffer may be selected to contain a user definable pattern that is scanned into a part or may use a hardwired predefined pattern. As shown, a local control (or local control device) may be coupled to a plurality of I/O buffers. The local control may control each I/O buffer. As one example and as will be described below, the local control may contain a state machine to sequence through the patterns in the I/O as well as control logic to determine pattern sequence time and state machine control. Additionally, a higher level global control (or global control register) may be coupled to a plurality of the local controls. The global control may be used for starting and stopping the pattern generator as well as global reporting of the completion of the pattern transfer and any errors that have occurred on the bus during the pattern transfer. A user may interface with the IBIST architecture through the global control, for example.

Figure 3:
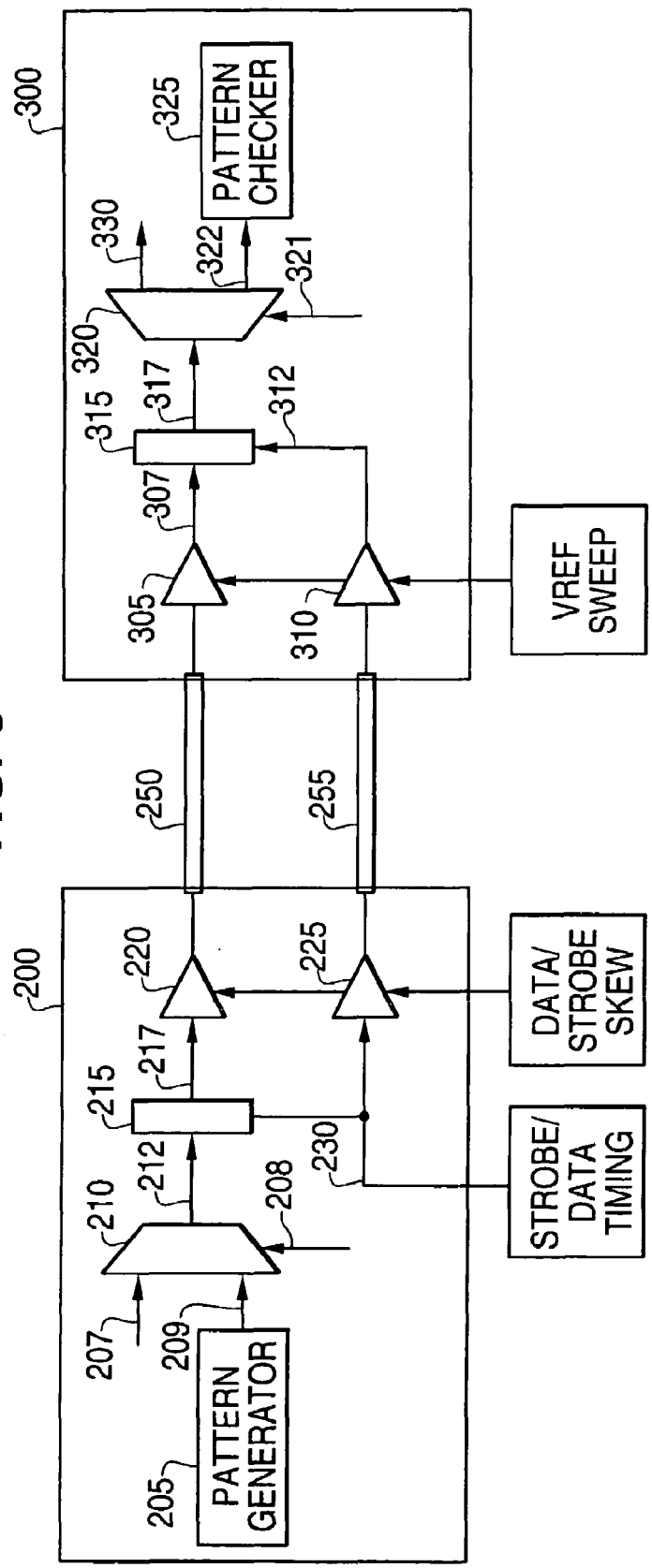
FIG. 3 is a circuit diagram for an interconnect built-in self test (IBIST) according to an example embodiment of the present invention.

FIG. 3 is a circuit diagram of components for an IBIST architecture between two components according to an example embodiment of the present invention. Other embodiments and configurations are also within the scope of the present invention. More specifically, FIG. 3 shows a first component 200 and a second component 300 coupled together by a data bus 250 and a strobe bus 255. The components 200 and 300 may correspond to elements (such as processors, memory hubs, buffers, etc.) within computer system platforms such as described above. For ease of illustration, only certain elements are shown within each of the components 200 and 300. The first component 200 includes a pattern generator 205, a multiplexer 210, an input/output latch 215, and buffers 220 and 225. The multiplexer 210 receives signals on input signal line 207 from a core (not shown) during a normal mode (or normal operation), and receives signals on input signal line 209 from the pattern generator 205 during a testing mode (or testing operation). A select signal may be applied along signal line 208 to a select input of the multiplexer 210 based on the desired mode of operation. The select input allows selection of one of signal lines 207 or 209 as an output of the multiplexer 210. The select signal may be provided from a controller such as a local control device. Essentially, the select signal selects between a test mode and a normal mode.

The pattern generator 205 is loaded with a plurality of bits for testing an interconnect such as the bus 250 between the first component 200 and the second component 300. For example, the pattern generator 205 may receive a fixed pattern or bit stream for use in a fixed (or stress) mode. Alternatively, the pattern generator 205 may receive another pattern (of bits) for use in an open mode. This other pattern may be input by a user through a test access port, for example.

The multiplexer 210 may output signals along signal line 212 to the latch 215. Based on the appropriate clock signal, the latch 215 may output the latched signals along signal line 217 to the buffer 220. The buffer 220 thereafter outputs the buffered signals along the data bus 250 to the second component 300. As shown in FIG. 3, strobe/data timing signals may be input along signal line 230 to the clock input of the latch 215 and the buffer 225. Data/strobe skew signals may operate as control signals for each of the buffers 220 and 225. The strobe/data timing signals may be output from the buffer 225 along the strobe bus 255 to the second component 300.

The second component 300 includes buffers 305 and 310, an input/output latch 315, a multiplexer 320 and a pattern checker 325. The buffer 305 may receive signals from the data bus 250 and the buffer 310 may receive strobe/data timing signals from the strobe bus 255. The buffers 305 and 310 may receive control signals such as Vref sweep. The buffer 305 may output signals along signal line 307 to the latch 315. Based on the appropriate clock signals along signal line 312 (from the buffer 310), the latch 315 may output the latched signals along signal line 317 to the multiplexer 320. A select signal may be applied along signal line 321 to a select input of the multiplexer 320 based on the desired mode of operation. The select input allows input signals to be output along signal line 330 to the core (not shown) during a normal mode (or normal operation) or allows input signals to be output along signal line 322 to the pattern checker 325 during a testing mode (or testing operation). The select signal input to the multiplexer 320 on signal line 321 may correspond to the select signal input to the multiplexer 210 on the signal line 208. Additionally, the select signal may be provided from a controller such as a local control device. Essentially, the select signal selects between a test mode and a normal mode.

Similar to the pattern generator 205 discussed above, the pattern checker 325 may be loaded with a plurality of bits for testing the interconnect such as the bus 250 between the first component 200 and the second component 300. For example, the pattern checker 325 may receive a fixed pattern (or bit stream) for use in a fixed mode. Alternatively, the pattern checker 325 may receive another pattern (of bits) for use in an open mode. This other pattern may be input by a user through a test access port, for example. The pattern checker 325 is loaded with the same bits as the pattern generator 205.

In the test mode, the pattern checker 325 may check the received bits from the multiplexer 320 with the pattern (of bits) stored in the pattern checker 325 (input as a fixed pattern or another pattern input by a user). The pattern checker 325 may determine if an error has occurred based on this comparison. Any error may have been based on the properties or structure of the interconnect such as the bus 250 between the first component 200 and the second component 300. The pattern checker 325 may issue a status report (or a status bit) based on the comparison. The status report may state, describe or indicate that an error has occurred or that a successful transfer has occurred. As one example, the pattern received at the pattern checker 325 from the multiplexer 320 should correspond to the pattern output from the pattern generator 205 if no error occurs along the data bus 250.

Each component having the IBIST technology (such as the first component 200 and the second component 300) may be configured as either a transmitting agent or a receiving agent. Both the components 200 and 300 configured as transmitting agents and receiving agents may be loaded with a designated pattern (or bit stream) for testing/execution. That is, identical patterns may be loaded into the transmitting/receiving agents. In the transmitting agent (such as the first component 200), the pattern may be loaded into a pattern generator (such as the pattern generator 205). In the receiving agent (such as the second component 300), the pattern may be loaded into a pattern checker (such as the pattern checker 325). Once all the board/platform's IBIST components have been configured and loaded with the appropriate test pattern (such as within the respective pattern generators 205 and pattern checkers 325), then testing of the interconnects between components may occur in a test mode. The transmitting agent (such as the first component 200) on the bus (or other type of interconnect) may initiate the bus cycles to send the stored pattern from the transmitting agent to the receiving agent (such as the second component 300). In this example, the transmitting agent may not perform any error checking on the pattern and the receiving agent may not transmit any pattern information onto the bus. Rather, the receiving agent may compare the initially loaded pattern (within the pattern checker 325) with the transmitted pattern data from the transmitting agent.

Synchronization on the bus between components may occur in a same manner as synchronization of the bus in normal operation. That is, synchronization may occur by using a bus clock for common clock busses and strobes for source synchronous busses.

Figure 4:
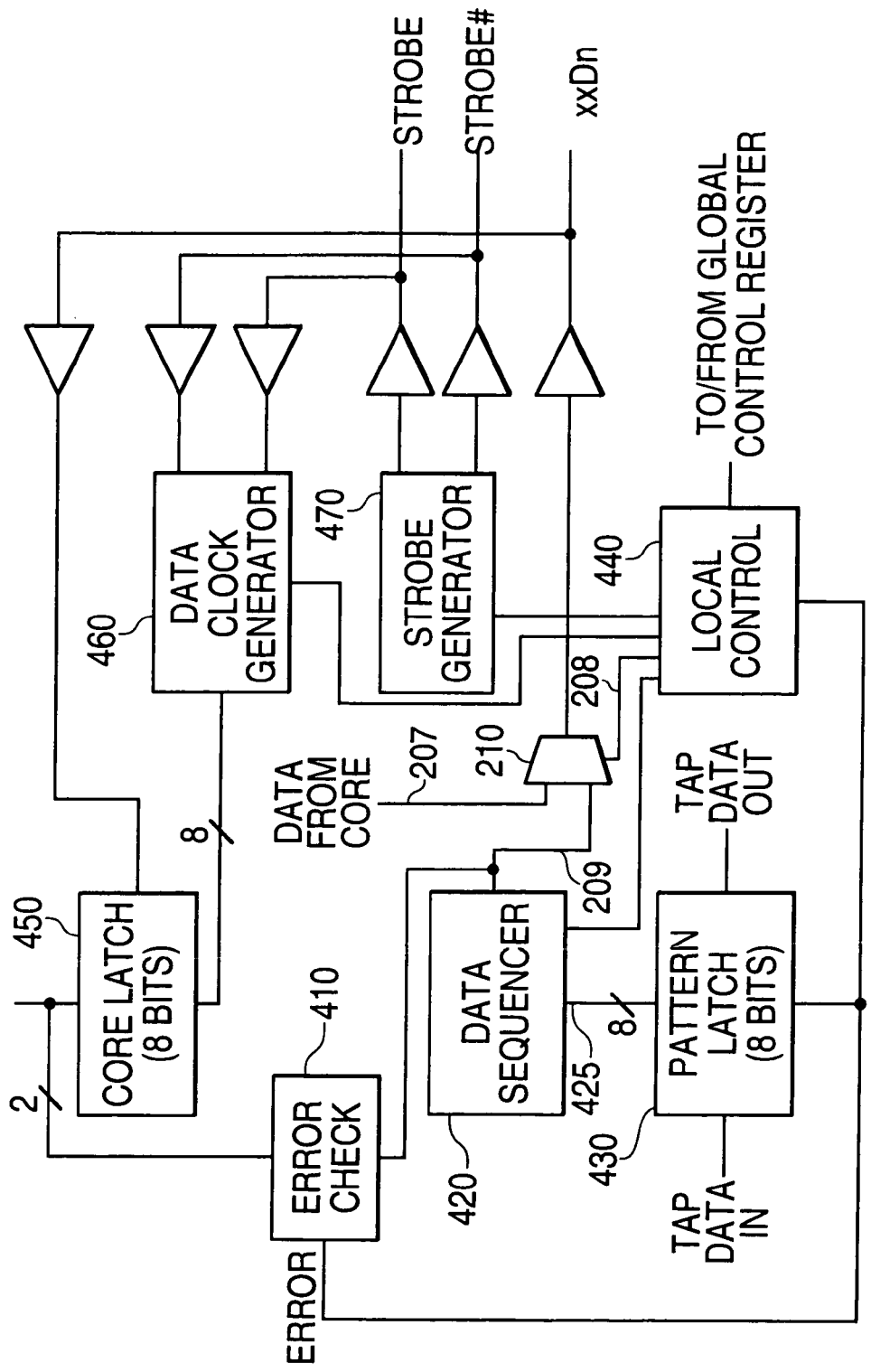
FIG. 4 is a circuit diagram of an IBIST architecture incorporated into a source synchronous bus architecture according to an example embodiment of the present invention.

FIG. 4 is a circuit diagram of an IBIST architecture incorporated into a source synchronous bus architecture according to an example embodiment of the present invention. Other embodiments and configurations are also within the scope of the present invention.

Each component (such as processors, memory hubs, buffers, etc.) integrating the IBIST architecture may contain an N bit pattern latch 430, a bit (or data) sequencer 420, an error checking logic device 410 and local control 440. In this embodiment, the error checking logic device 410 may correspond to the pattern checker 325 shown in FIG. 3. Additionally, the data sequencer 420 may correspond to the output of the pattern generator 205 shown in FIG. 3. As may be seen, the data passes through the multiplexer 210 and is sent across the bus (shown as data line xxDn in FIG. 4). That is, data may be transmitted along data line xxDn to the bus (for transmission to another component). FIG. 4 only shows a single pad connection (or single bit) to the bus although the system may have other pad connections to the bus. These other pad connections are not shown for ease of illustration. In the FIG. 4 illustration, N corresponds to 8. Other values of N are also within the scope of the present invention.

The circuit diagram also includes circuit elements that are common to a normal processor operating by use of a source synchronous bus. These elements include a core latch 450 to receive bits from the core (not shown), a data clock generator 460, a strobe generator 470 and buffers. The strobe generator 470 may be responsible for providing the strobe synchronous signals Strobe and Strobe#. These components operate in a normal manner by use of the strobe synchronous signals Strobe and Strobe#. Additionally, data may be received along data line xxDn and fed to the core latch 450 through one of the buffers.

The N bit pattern latch 430 may be a serial/parallel latch that is in a user defined, private scan chain. Each I/O buffer (such as those shown in FIG. 2) may be coupled to this chain in a serial fashion. The pattern latch 430 may be clocked by a Test Access Port (TAP) clock for serial scan in/out operation. The pattern latch 430 may also have a parallel load clock for loading data to be scanned out. The N bit pattern to be sent or received from the bus (or other type of interconnect) may be shifted into the pattern latch 430. Each parallel output from the pattern latch 430 may be output to the bit sequencer 420 along signal lines 425. Controls of the bit sequencer 420 may be coupled by signal lines (such as three lines) to a pattern state machine provided within the local control 440. These control signals may be decoded in the bit sequencer 420 to select one of N bits of pattern data to be sent out to the pad (of the bus) in a transmit mode or to be sent to the error logic in a receive mode. The error checking logic device 410 may be coupled to both the output of the pattern sequencer 420 and the core data latch 450.

Error checking may be done by the pattern checker 325 (FIG. 3) or the error checking device 410 (FIG. 4) during/subsequent to a pattern transfer. The error checking may be done on a bit by bit basis. Once the pattern checker 325 or the error checking device 410 has determined that an error has occurred in the transferred pattern, the pattern latch 430 may be latched for an entire pattern transfer and the pattern checker 325 or the error checking device 410 may report the error in real time. The error bit in each latch may be sent to the pattern latch 430 so that the error condition of each latch can be scanned out of the pattern latch 430 at the end of a pattern transfer to determine the I/O buffer having the error condition. This error condition may represent an error of the interconnect associated with that buffer. The error bits from each I/O buffer may also be coupled to the local control 440 for each bus group. An error signal may be sent to the local control 440 to record when a first error occurs in the pattern transfer in both the open mode and the fixed (or stress) mode. This pattern data may be scanned out of registers within the local control 440. The error signals from each local control 440 may be coupled to an error bit in a global control register (within the global register of FIG. 2) that enables monitoring of this register to check error conditions after and/or during each test.

The local control 440 may contain a pattern sequencing state machine and various counters (or registers) that control pattern transfers on the bus. The state machine may operate in both a transmit mode and a receive mode. The state machine may send the sequence control data bits to each buffer to be decoded by the pattern sequencers (such as the pattern sequencer 420). The counters within the local control 440 may determine how many times an N bit pattern is transferred. This may be used to control operation of the state machine. The counters may also be used in a fixed (or stress) mode to control the pattern sequence generation. The local control 440 may also include a clock frequency controller to set the pattern frequency on the bus. Clocking for the pattern state machine may come from one of two sources depending on the mode of operation. In a transmit mode, the data transmit clock used by each bus cluster may be used. On the other hand, in a receive mode, the state machine may be clocked from a clock generated by the logic used in the bus synchronization and depends on the type of bus being used. For example, the strobe from a source synchronous bus may be used along with a qualified bus clock on a common clock bus. In a common clock bus, the bus clock may be qualified by another signal to indicate the start and end of a pattern transfer since the bus clock is continuously running as opposed to a source synchronous bus where the strobes only toggle during data transfer.

The global control circuitry (such as in FIG. 2) may include a control register for the entire pattern generator. The control register may be included in the pattern generator scan chain. The register may contain a global start/stop bit, a global error bit, and a global parallel load bit.

FIG. 5 is a flow chart showing operations according to an example embodiment of the present invention. Other embodiments, operations and orders of operations are also within the scope of the present invention.

More specifically, in block 602, each IBIST component may be configured as a transmitting agent or a receiving agent. That is, each bus associated with a component having the IBIST technology may be configured as either a transmitting agent or a receiving agent by the loading of an IBIST configuration register prior to test execution.

In block 604, the mode of the IBIST components and various IBIST controls are set. For example, both the components configured as transmitting agents and receiving agents are loaded with a designated pattern (setting IBIST mode and control features) prior to execution. An identical pattern may be loaded into both the transmitting agent and the receiving agent.

In block 606, each bus bit may be configured as a transmitting agent or a receiving agent. For each bus segment to be tested, each I/O component may be configured as a transmiting agent or a receiving agent prior to test execution. While the above operations have been described as separate operations, one skilled in the art would understand that each of blocks 602-606 may be performed together with one pattern.

In block 608, the IBIST test may be executed. For example, testing may begin once all the board/platform's IBIST capable components have been configured and loaded with the designated test patterns. The transmitting agent on the bus may initiate the bus cycles to send the pattern to the receiving agent. The transmitting agent does not perform error checking on the pattern. The receiving agent does not transmit any pattern information onto the bus but rather uses the initially loaded pattern to compare with the transmitted pattern data for error checking. Synchronization on the bus between components using the IBIST pattern generator may be accomplished in the same manner the bus is used in normal operation.

In step 610, a determination is made whether all bits of a pattern have been tested. That is, the testing methodology may focus on testing a single bit on a bus at a time (i.e., the receiving agent). Thus, the test algorithm may reconfigure the bus receiving agents at the end of each test pass to facilitate testing a complete bus. If the determination is negative in block 610 then the operations may return to block 602. On the other hand, if the determination is positive in block 610, then a status report of the testing (and thus the interconnect) may be issued in block 612.

Embodiments of the present invention may use an on-die IBIST architecture for system level bus testing in a high volume manufacturing environment as well as during electrical verification and validation. This methodology may replace invasive probing. As such, embodiments of the present invention may maintain/increase board test coverage levels, reduce platform test time, eliminate the need for invasive probing in electrical verification/validation, facilitate platform level test access and availability, and enable test reduction/elimination. The architecture/methodology may be used during platform tests to perform tests ranging from simple opens/shorts tests on the bus to complex pattern transfers. Testing a bus between components in this way allows testing of the entire bus, silicon, motherboard, interconnect and power delivery.

The on-die functionality of the IBIST architecture may be a stand-alone circuit that is not tied to normal system operation. This stand-alone capability provides an integrated pattern generator addressing the high frequency fault spectrum. A scan based user defined pattern capability enabling the execution of custom vectors may also be integrated to provide the user with maximum flexibility. The IBIST architecture may be used with or without booting an operating system on the platform. This may save time, increase coverage in test and debug, and also allow bus debug and testing prior to the operating system boot. In situations where the system is too unstable to boot an operating system and run system software, this capability may facilitate the quick isolation of bus related anomalies. The integrated pattern generator may be designed to send or receive data on the bus at full bus speed to cover normal operation conditions. The integrated pattern generator may check for error conditions at the receiver indicating bus failures.

Embodiments of the present invention have been described with respect to a signal/signal line or signals/signal lines. It is intended that the singular use and the plural use of these terms are interchangeable.

Any reference in this specification to "one embodiment", "an embodiment", "example embodiment", etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment or component, it is submitted that it is within the purview of one skilled in the art to effect such feature, structure, or characteristic in connection with other ones of the embodiments and/or components. Furthermore, for ease of understanding, certain method procedures may have been delineated as separate procedures; however, these separately delineated procedures should not be construed as necessarily order dependent in their performance, i.e., some procedures may be able to be performed in an alternative ordering, simultaneously, etc.

Although the present invention has been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. An apparatus comprising:
   a first component having a pattern generators,
   wherein the pattern generator stores a first pattern of bits;

a second component having a pattern checker, wherein the pattern checker stores a second pattern of bits; and an interconnect coupled between the first component and the second component, wherein the first and second pattern of bits are configured and loaded before the interconnect is tested, wherein the pattern checker compares a pattern received from the interconnect with the second pattern of bits previously stored in the pattern checker.

2. The apparatus of claim 1 wherein the second component includes logic to determine if an error occurs while transferring a pattern from the first component to the second component, the logic operating based on the comparison.

3. The apparatus of claim 2, wherein the apparatus includes a mechanism to load a user defined pattern of bits into the pattern generator as the first pattern of bits and to load the user defined pattern of bits into the pattern checker as the second pattern of bits.

4. The apparatus of claim 1, further comprising logic to switch between a normal mode and a test mode, the pattern checker operating in the test mode to determine if an error occurs during transmission of bits across the interconnect.

5. The apparatus of claim 1, wherein the interconnect comprises a bus coupled between the first component and the second component.

6. The apparatus of claim 1, wherein the first component comprises one of a processor, a memory hub and a buffer chip, and the second component comprises one of a processor, a memory hub and a buffer chip.

7. The apparatus of claim 1, wherein the pattern checker comprises on-die circuitry provided within silicon of the second component.

8. The apparatus of claim 1, wherein the pattern generator comprises on-die circuitry provided within silicon of the first component.

9. The apparatus of claim 1, further comprising internal interconnect built-in self-testing (IBIST) circuit elements comprising an error checking device, a local control device, a pattern latch, and a pattern sequencer.

10. A testing apparatus comprising:

a transmitting agent having a mechanism to store a first pattern of bits; and a receiving agent having a mechanism to store a second pattern of bits and to compare a pattern of bits received from the transmitting agent with the stored second pattern of bits;

wherein the first and second pattern of bits are configured and loaded before the testing apparatus is used for testing.

11. The testing apparatus of claim 10, further comprising an interconnect coupled between the transmitting agent and the receiving agent.

12. The testing apparatus of claim 11, wherein the interconnect comprises a bus coupled between the transmitting agent and the receiving agent.

13. The testing apparatus of claim 10, wherein the receiving agent includes logic to determine if an error occurs while transferring a pattern from the transmitting agent to the receiving agent, the logic operating based on a comparison at the receiving agent.

14. The testing apparatus of claim 10, wherein the apparatus includes a mechanism to load a user defined pattern of bits into the transmitting agent and the receiving agent.

15. The testing apparatus of claim 10, further comprising logic to switch between a normal mode and a test mode, the receiving agent operating in the test mode to determine if an error occurs during transmission of bits across an interconnect between the transmitting agent and the receiving agent.

16. The testing apparatus of claim 10, wherein the transmitting agent comprises one of a processor, a memory hub and a buffer chip, and the receiving agent comprises one of a processor, a memory hub and a buffer chip.

17. The testing apparatus of claim 10, further comprising a control hierarchy comprising a chip-level analysis, a board-level analysis, and/or system-level analysis for platform testing.

18. A method of testing comprising:

transmitting a first plurality of bits from a first component along an interconnect, wherein the first plurality of bits is stored in the first component prior to the start of testing:

receiving the transmitted first plurality of bits at a second component, wherein the second plurality of bits is stored in the second component prior to the start of testing; and comparing the received plurality of bits with the second plurality of bits stored at the second component.

19. The method of claim 18, further comprising determining if an error occurs while transferring the first plurality of bits from the first component to the second component based on the comparison.

20. The method of claim 18, further comprising loading a user defined pattern of bits into the first component as the first plurality of bits and loading the user defined pattern of bits into the second component as the second plurality of bits.

21. The method of claim 18, wherein the comparison occurs on a bit by bit basis.

22. The method of testing of claim 18, wherein the testing is independent of the operating system or cache protocol throughout the life of the platform.

* * * * *